US007904787B2

(12) United States Patent
Clark et al.

(10) Patent No.: US 7,904,787 B2
(45) Date of Patent: Mar. 8, 2011

(54) PIPELINED CYCLIC REDUNDANCY CHECK FOR HIGH BANDWIDTH INTERFACES

(75) Inventors: Scott Douglas Clark, Rochester, MN (US); Dorothy Marie Thelen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1094 days.

(21) Appl. No.: 11/621,220

(22) Filed: Jan. 9, 2007

(65) Prior Publication Data

US 2008/0168323 A1 Jul. 10, 2008

(51) Int. Cl.
*H03M 13/00* (2006.01)

(52) U.S. Cl. .......................... 714/758; 714/763; 714/781

(58) Field of Classification Search .................. 714/758, 714/733, 763, 779, 781, 786, 790, 791, 798
See application file for complete search history.

(56) References Cited

U.S. PATENT DOCUMENTS

| | | | | |
|---|---|---|---|---|
| 5,111,458 | A * | 5/1992 | Hara | 714/45 |
| 5,303,302 | A * | 4/1994 | Burrows | 713/161 |
| 6,411,984 | B1 * | 6/2002 | Leach et al. | 709/200 |
| 6,530,057 | B1 * | 3/2003 | Kimmitt | 714/758 |

* cited by examiner

*Primary Examiner* — Fritz Alphonse
(74) *Attorney, Agent, or Firm* — Patterson & Sheridan, LLP; James R. Nock

(57) ABSTRACT

Techniques for validating the integrity of a data communications link are provided. By executing error correction/detection calculations, such as CRC calculations, in a pipelined manner, logic may be distributed over multiple machine cycles. As a result, delay involved in the logic for each cycle may be reduced, allowing calculations in systems with higher clock frequencies.

11 Claims, 8 Drawing Sheets

100
110
CENTRAL PROCESSING UNIT
112 COMMAND PROCESSOR
CACHE 114
ON CHIP BUS 116
IMPUT OUTPUT CONTROLLER
MULTI-CYCLE CYCLIC REDUNDANCY CHECK
118
122
120 COMMUNICATIONS LINK

400

| | | | | | | | | | | | |
|---|---|---|---|---|---|---|---|---|---|---|---|
| BIT 0 | - | 0xFF88 | 0x4525 | 0x3E82 | 0xC0AB | 0x96A7 | 0xC2CD | 0x8205 | 0x8E2C | 0x0C88 | $410_0$ |
| BIT 1 | - | 0xFFC4 | 0x2292 | 0x9F41 | 0x6055 | 0xCB53 | 0xE166 | 0xCI02 | 0xC716 | 0x0644 | |
| BIT 2 | - | 0xFFE2 | 0x1149 | 0x4FA0 | 0xB02A | 0xE5A9 | 0xF0B3 | 0x6081 | 0x638B | 0x0322 | |
| BIT 3 | - | 0x7FF1 | 0x08A4 | 0xA7D0 | 0x5815 | 0x72D4 | 0xF859 | 0xB040 | 0xB1C5 | 0xB191 | |
| BIT 4 | - | 0x4070 | 0xC177 | 0x6D6A | 0xBCA1 | 0x2FCD | 0xBEE1 | 0x5A25 | 0xD6CE | 0xCC40 | |
| BIT 5 | - | 0xA038 | 0x60BB | 0xB6B5 | 0x7650 | 0x97E6 | 0xDF70 | 0xAD12 | 0xEB67 | 0x5620 | |
| BIT 6 | - | 0xD01C | 0x305D | 0xDB5A | 0xBB28 | 0x4BF3 | 0x6FE8 | 0x5689 | 0x75B3 | 0xB310 | |
| BIT 7 | - | 0xE80E | 0x182E | 0xEDAD | 0x5D94 | 0x25F9 | 0xB7DC | 0x2B44 | 0xBAD9 | 0xD988 | |
| BIT 8 | - | 0x7407 | 0x0C17 | 0x76D6 | 0xAECA | 0x12FC | 0xDEEE | 0x15A2 | 0x5D6C | 0xECC4 | |
| BIT 9 | - | 0x3A03 | 0x860B | 0xBB6B | 0x5765 | 0x097E | 0x6DF7 | 0x0AD1 | 0x2EB6 | 0x7662 | |
| BIT 10 | - | 0x1D01 | 0xC305 | 0xD0B5 | 0xABB2 | 0x84BF | 0x36FB | 0x8568 | 0x975B | 0x3B31 | |
| BIT 11 | - | 0xF108 | 0xA4A7 | 0xD058 | 0x1572 | 0xD4F8 | 0x59B0 | 0x40B1 | 0xC581 | 0x9110 | |
| BIT 12 | - | 0xF884 | 0x5253 | 0xE62C | 0x0AE9 | 0x6A7C | 0x2CD8 | 0x2058 | 0xE2C0 | 0xC888 | |
| BIT 13 | - | 0xFC42 | 0x2929 | 0xF416 | 0x055C | 0xB53E | 0x166C | 0x102C | 0x7160 | 0x6444 | |
| BIT 14 | - | 0xFE21 | 0x1494 | 0xFA0B | 0x02AE | 0x5A9F | 0x0B36 | 0x0816 | 0x38B0 | 0x3222 | |
| BIT 15 | - | 0xFF10 | 0x8A4A | 0x7D05 | 0x8157 | 0x8D4F | 0x859B | 0x040B | 0x1C58 | 0x1911 | $410_{15}$ |

FIG. 4

800
810
144 BIT INPUT
16
16X1
820
BIT 15
BIT 0
9
144 BITS
850
18X1
17X1
16X1
15X1
14X1
13X1
21X1
20X1
19X1
854
852
850
16 BIT CRC REGISTER
830
840

PIPELINED CYCLIC REDUNDANCY CHECK FOR HIGH BANDWIDTH INTERFACES

BACKGROUND OF THE INVENTION

1. Field of the Invention

The invention relates to validating transmitted data and, more particularly, to performing a running cyclic redundancy check over multiple machine cycles.

2. Description of the Related Art

Error detection mechanisms, such as Cyclic Redundancy Check (CRC) values are commonly generated on data packets as a method for validating the integrity of a data communications link between devices. Examples of such links include a bus between a central processing unit (CPU) and a graphics processing unit (GPU) in a computer or gaming console. At the sending device, a CRC (generated on data to be sent in a packet) may be appended to the packet. At the receiving device, a CRC may be generated on the data, as received, and compared against the CRC appended to the packet. A mismatch between the CRC generated on the data as received and the CRC appended to the data packet indicates an error in the communications link.

CRCs may be based on a bit serial mathematical transform of the data transmitted in a packet between devices. To speed calculations, some systems may calculate the CRC in a parallel manner using multiple bits per machine cycle. There may be several methods for doing this parallel calculation. In one method, the parallel calculation may be performed by sending a wide internal dataflow through a large array of exclusive "or" (XOR) logic gates and creating a running CRC per machine cycle. The running CRC may also be fed back and used in the generation of a subsequent CRC value. The process may continue until the end of the transmission packet over which the CRC is protecting the integrity.

As the bandwidth of communication links increases, leading to wider internal dataflows, the size and depth of the XOR array may continue to grow and the logic delay may become too large to calculate in a single machine cycle. This may be particularly true in machines operating at high frequency, where a single clock period is equivalent to the latency of a relatively small number of logic gates.

Accordingly what is needed is an improved method for validating the integrity of a data communications link.

SUMMARY OF THE INVENTION

Embodiments of the present invention generally provide techniques and apparatus for validating the integrity of a data communications link.

One embodiment provides a method of calculating an error detection code in a pipelined manner. The method generally includes generating an intermediate value by performing a first portion of an error detection code algorithm, based on a multi-bit data structure, in a first pipeline stage in a first clock cycle, and generating a final value for the error detection code by performing a second portion of the error detection code algorithm, based on the intermediate value, in a second pipeline stage in a second clock cycle.

One embodiment provides a pipelined circuit for generating a checksum for a multi-bit data structure generally including first and second pipeline stages. The first pipeline stage is for generating an intermediate value by performing a first portion of an error detection code algorithm, based on the multi-bit data structure, in a first clock cycle. The second pipeline stage is for generating a final value of the checksum by performing a second portion of the error detection code algorithm, based at least on the intermediate value, in a second clock cycle.

One embodiment provides an integrated circuit device generally including a communications link to connect with external devices, at least one processor core, input/output (I/O) logic for transferring data in packets between the processor core and the link, and checksum logic. The checksum logic is configured to calculate checksums to be appended to data packets transmitted from the device via the communications link and to calculate checksums to validate data received via the communications link. The checksum logic generally includes a first pipeline stage for generating an intermediate value by performing a first portion of an error detection code algorithm, based on the multi-bit data structure, in a first clock cycle and at least a second pipeline stage for generating a final value of the checksum by performing a second portion of the error detection code algorithm, based at least on the intermediate value, in a second clock cycle.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 illustrates a structured cyclic-redundancy check matrix in accordance with one embodiment of the present invention.

DETAILED DESCRIPTION OF THE PREFERRED EMBODIMENTS

Embodiments of the present invention provide improved techniques for validating the integrity of a data communications link. By executing error correction/detection calculations, such as CRC calculations, in a pipelined manner, logic may be distributed over multiple machine cycles. As a result, delay involved in the logic for each cycle may be reduced, allowing calculations in systems with higher clock frequencies.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

To facilitate understanding, the following description will refer to the calculation of CRCs over multiple cycles as a particular, but not limiting, example. However, those skilled in the art will appreciate that the techniques described herein may be applied to any number of error detection and/or correction techniques utilizing a wide variety of different type algorithms.

Exemplary Environment

Figure 1:
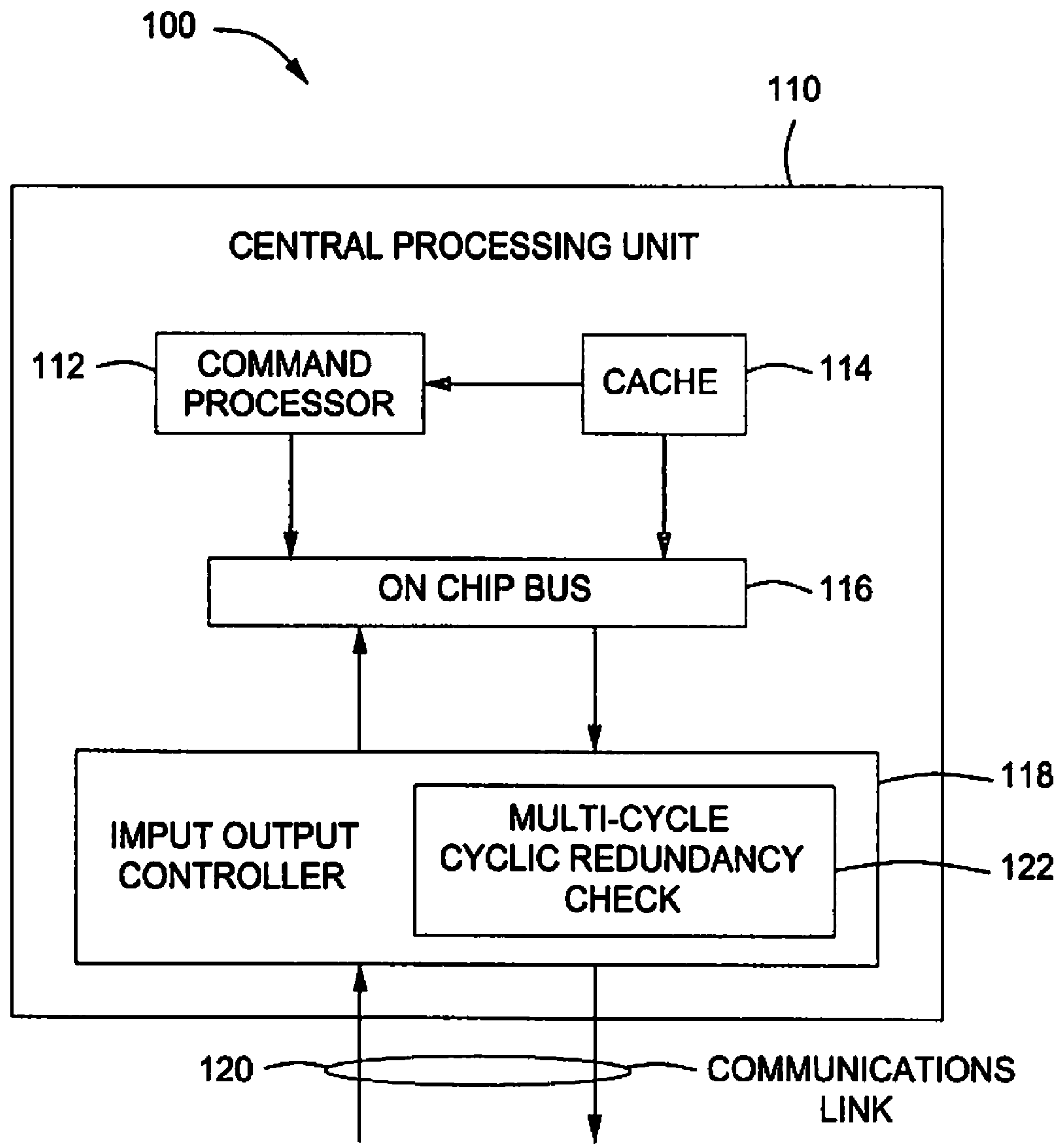
FIG. 1 illustrates an exemplary computing environment in which embodiments of the present invention may be utilized.

FIG. 1 illustrates an exemplary system 100 in which embodiments of the present invention may be utilized. System 100 may include a central processing unit (CPU) 110 which may communicate with a variety of devices, such as a graphics processing units (GPUs), via a communications link 120. For some embodiments, the communications link 120 may be a multi-bit serial bus, with multiple bits of data transferred in each bus cycle. As illustrated, the CPU 110 may include a processor core 112 communicably connected to a cache 114 and an on chip bus 116.

The CPU 110 may also include an input/output (I/O) controller 118 that serves as an interface between the processor core 112 and the bus 120. For example, the I/O controller 118 may be configured to receive data from processor core 112 (e.g., which may include graphics data to be sent to a GPU for display) via the on chip bus 116 and prepare ("packetize") the data for transmission via the communications link 120. Similarly, the I/O controller 118 may be configured to receive a data packet from another device via the communications link 120 and parse ("depacketize") the data for transmission to the processor core 112 via the on chip bus 116. As will be described in greater detail below, CRC logic 122 may be configured to generate CRCs over multiple clock cycles for data packets received and transmitted.

Figure 2:
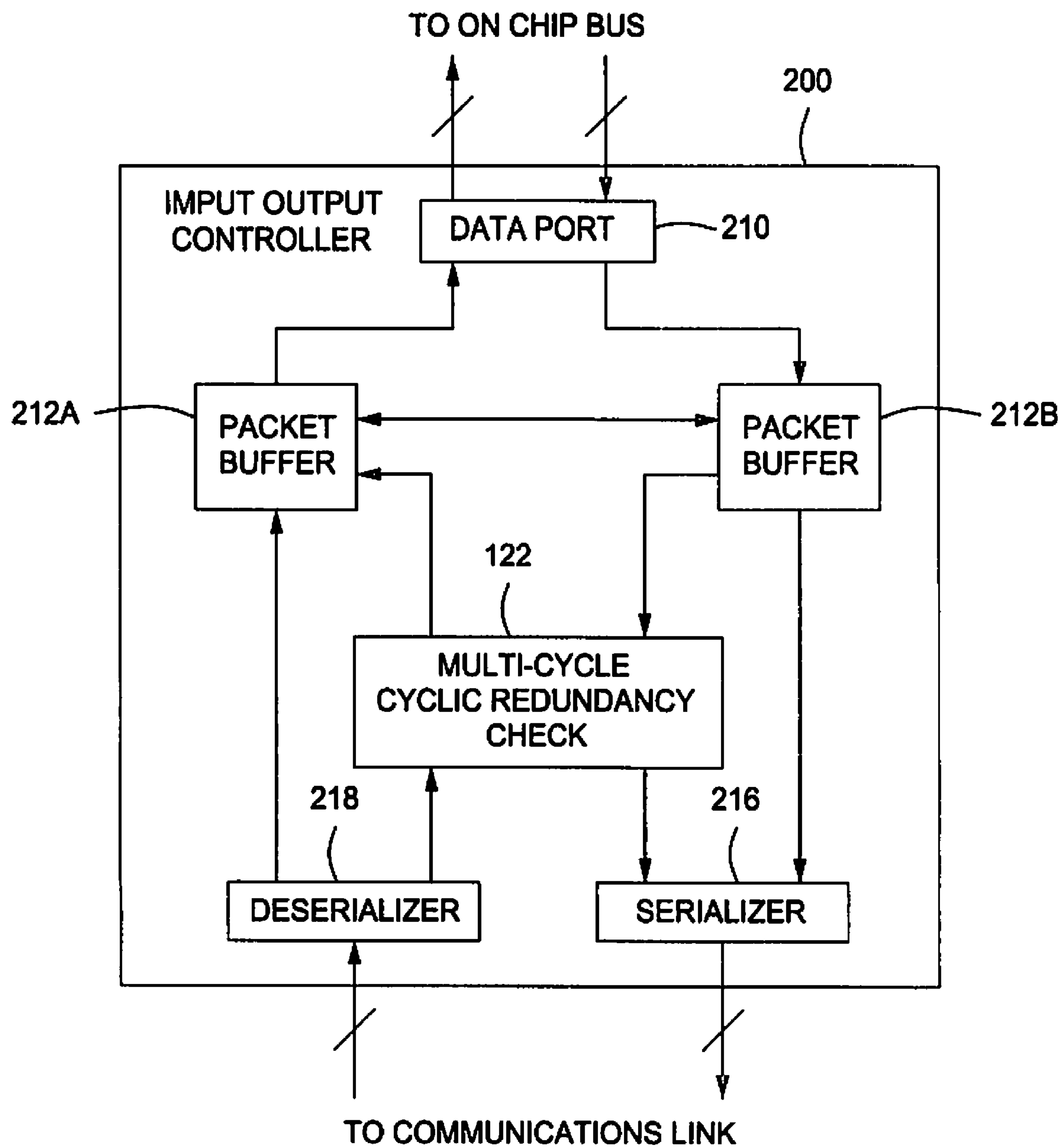
FIG. 2 illustrates an input output controller containing a multi-cycle cyclic redundancy check in accordance with one embodiment of the present invention.

FIG. 2 illustrates an exemplary embodiment of the I/O controller 118 in which CRC logic in accordance with the present invention may be implemented. The I/O controller may contain packet receive and transmit buffers 212A and 212B, respectively, multi-cycle CRC logic 122, a serializer 216, and a deserializer 218.

Packets are logically created except for the CRC and placed in the packet transmit buffer 212B for transmission. When it is time for transmission, the packet may be read out of the transmit buffer 212B and the CRC logic 122 may begin calculating the CRC. The CRC is calculated as the data is passed to the Serializer 216. When the CRC has been calculated, it is appended to the packet.

The Serializer 216 generally includes logic (e.g., multiplexors and the like), configured to take the internal dataflow (e.g., 18 Byte wide) and reformatting it for transmission to a data width of the communications link. For example, for some embodiments, the communications link may be from 1 to 6 bytes wide, and operates at several times (e.g., 3×) the frequency of the internal logic.

On the receive side, data received via the communications link is processed by the Deserializer 218. The Deserializer 218, in general, performs the reverse function of the Serializer 216, combining potentially smaller increments of data received over multiple bus cycles, up to the full data width of the internal dataflow. This data may then get parsed, while the CRC logic 122 creates a running CRC in parallel. When the full packet is received, including the appended CRC, it is matched against the running CRC.

A match indicates the contents of the packet are valid and may be may be used. In the event of a mismatch, action may be taken, for example, invoking upper level recovery mechanisms. For some embodiments, when a packet is received correctly, an acknowledgement may be communicated back to the sender indicating the packet was received successfully and a retransmission is not necessary.

Figure 3A:
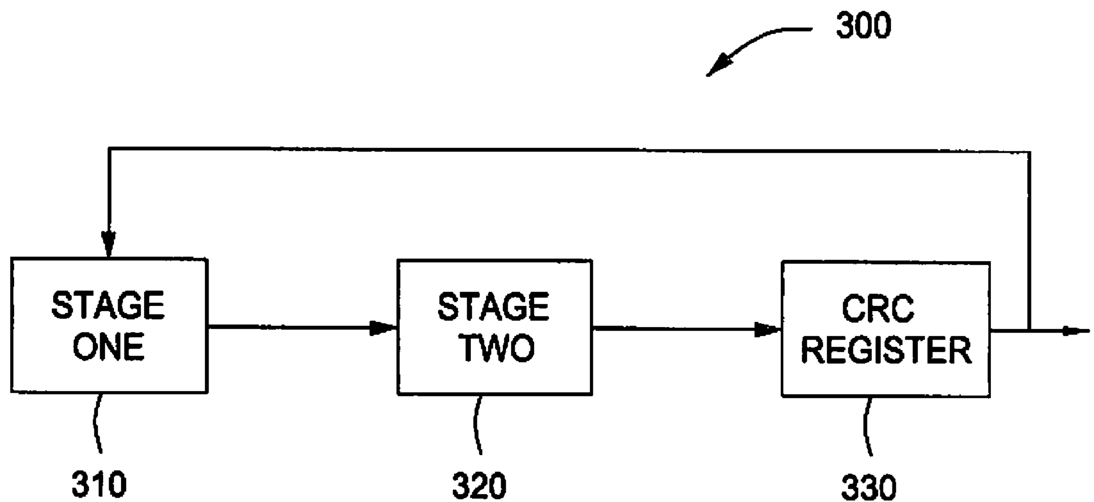
FIGS. 3A and 3B illustrate a two stage cyclic-redundancy check in accordance with one embodiment of the present invention.
Figure 3B:
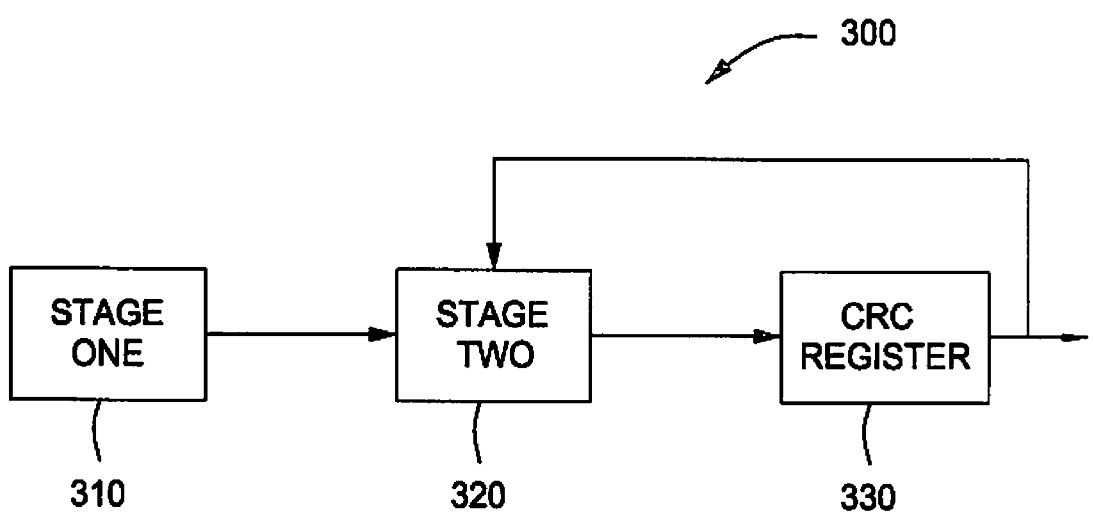

Embodiments of the present invention may divide the CRC calculations into multiple clock/machine cycles, resulting in fewer logic functions (and shorter gate paths) per cycle. For example, as illustrated in FIGS. 3A and 3B, the CRC logic 122 may include first and second stage logic 310 and 320 to perform CRC calculations in two machine cycles. In the first machine cycle, the first stage logic 310 may calculate a partial CRC for each of the running CRC bits across portions (subvectors) of the input data. In the second cycle, second machine cycle 320 may provide for the further reduction of the subvectors into the final running CRC. The final CRC may them be output to a cyclic redundancy check register 330.

Depending on the CRC algorithm used, the current running value of the CRC may be required to be combined and calculated with the new input data. For one embodiment, this feedback may be inserted into the appropriate subvector reduction in the first stage 310, as illustrated in FIG. 3A. For one embodiment, the feedback may be inserted into the appropriate subvector reduction in the second stage, as illustrated in FIG. 3B.

Exemplary Implementation

Those skilled in the art will recognize that the particular algorithm will depend on application particulars, such as internal bus width, strength desired, and the like. For some embodiments, a checksum (e.g., of 16 bits or greater) may be generated for a data structure that is 128 bits or greater. For example, assuming a 144-bit wide internal bus for one embodiment of the present invention, a multi-cycle CRC check may be implemented for a 144 bit input using the polynomial X^16+X^12+X^5+1 to generate a 16-bit checksum.

Once the polynomial is chosen, a matrix may be constructed in order to parallelize the CRC generation. The parallel CRC matrix may allow for increasing optimization in creating common building blocks that can optimize a physical layout of a chip. FIG. 4 illustrates an exemplary structured CRC matrix 400 for use with the polynomial X^16+X^12+X^5+1. The structured matrix 400 is shown in hexadecimal format with sixteen rows, the first row being row Bit 0 $\mathbf{410}_0$ and the last row being row Bit 15 $\mathbf{410}_{15}$. The structured matrix 400 also contains nine columns.

The first four entries 510-540 in row Bit 0 $\mathbf{410}_0$ are, in hexadecimal notation, 0xFF88, 0x4525 and 0x3E82, respectively, or b'1111111110001000', b'0100010100100101', and b'0011111010000010', respectively, in binary notation. Each '1' bit in the matrix may imply that the corresponding bit in an input vector may be used in the calculation of that particular bit in the final CRC value. The structured matrix 300 may aid in optimizing the physical layout of a chip by promoting the use of single wiring channels per bit, and by minimizing cross wiring.

Figure 6:
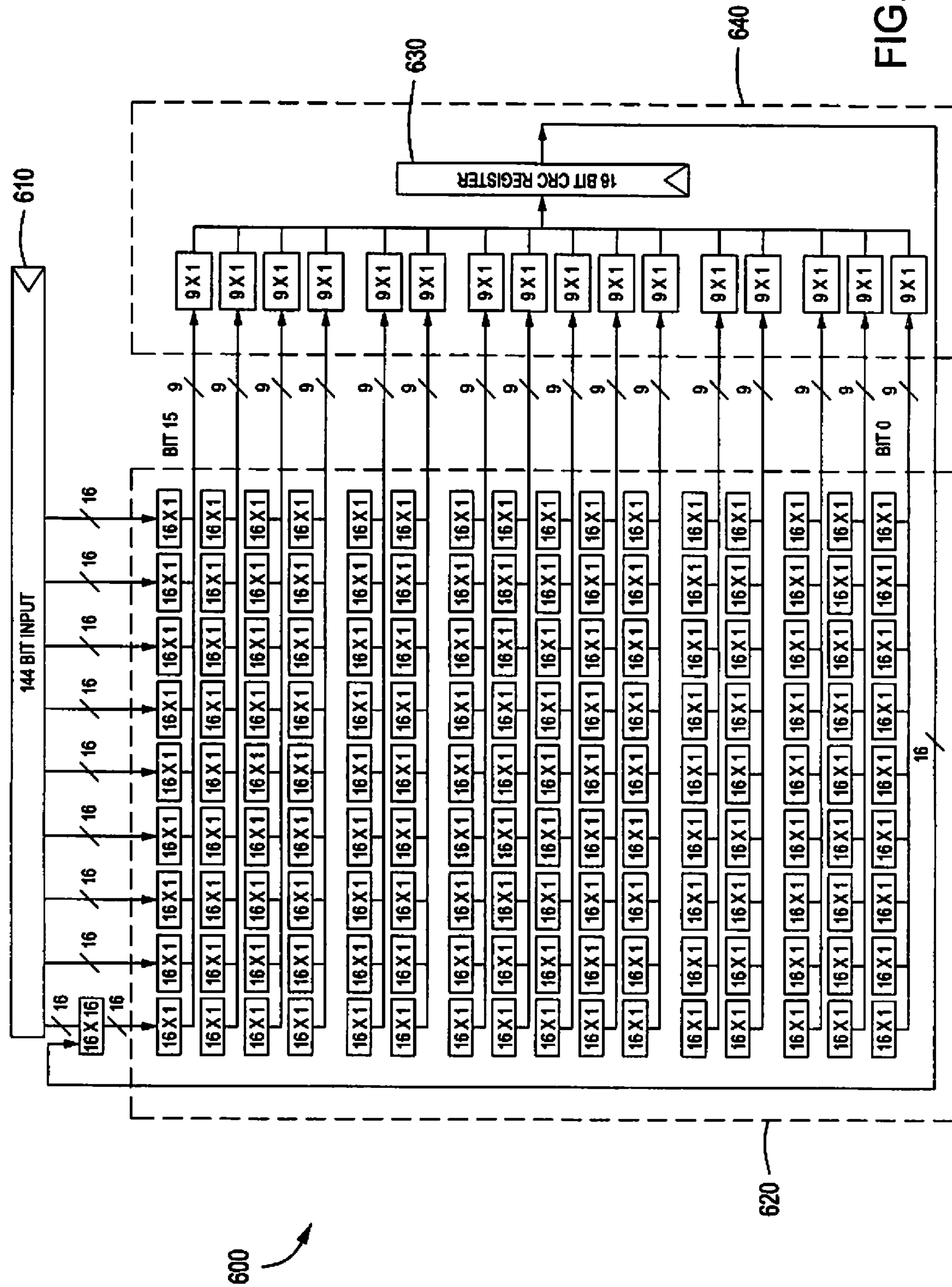
FIG. 6 illustrates a two stage cyclic-redundancy check generation in accordance with one embodiment of the present invention.

Due to the nature of the CRC arithmetic being used, some embodiments may use exclusive or (XOR) blocks to create an intermediate vector. FIG. 6 illustrates structured parallel cyclic-redundancy check generation 600 for a 144-bit input 610. A 16×9 grid of 16×1 XOR blocks 620 may be used to create the intermediate vector. Each of the nine bits of the intermediate vector may be reduced in a second stage 640. The second stage 640 may be constructed of sixteen 9×1 XOR blocks and may create a final CRC, which is output to a 16 bit CRC register 630.

The physical layout of the stage one grid 620 may promote vertical wiring channels from any given bit of the input vector 610, to each of the 16 XOR blocks that are used in the calculation of each of the 16 bits of the final CRC result output to the 16 bit CRC register 630. Since not every input bit of the 144 bit input participates in the calculation of the cyclic-redundancy check (CRC), as shown in the structured CRC matrix 400, connections may be made to the XOR blocks only where specific bits participate in the intended output. Similarly, unused inputs to the XOR may be tied to logic 0. Each of the nine bits of the intermediate vector calculated in stage one 620 may then be sent to the second stage 640 and the final CRC value calculated.

The final CRC value may be stored in the CRC register 630 and then used to check the validity of a received message or appended to a message to be transmitted. Because the data may exceed 144 bits, it may be necessary to calculate a running CRC. In some embodiments the output from the CRC register 630 may be sent to a 16×16 XOR block 650. Sixteen bits from the input 610 may also enter the 16×16 XOR block 650. The sixteen bit result from XOR block 650 may then be sent to the first stage 620, thereby creating a running CRC.

Figure 7:
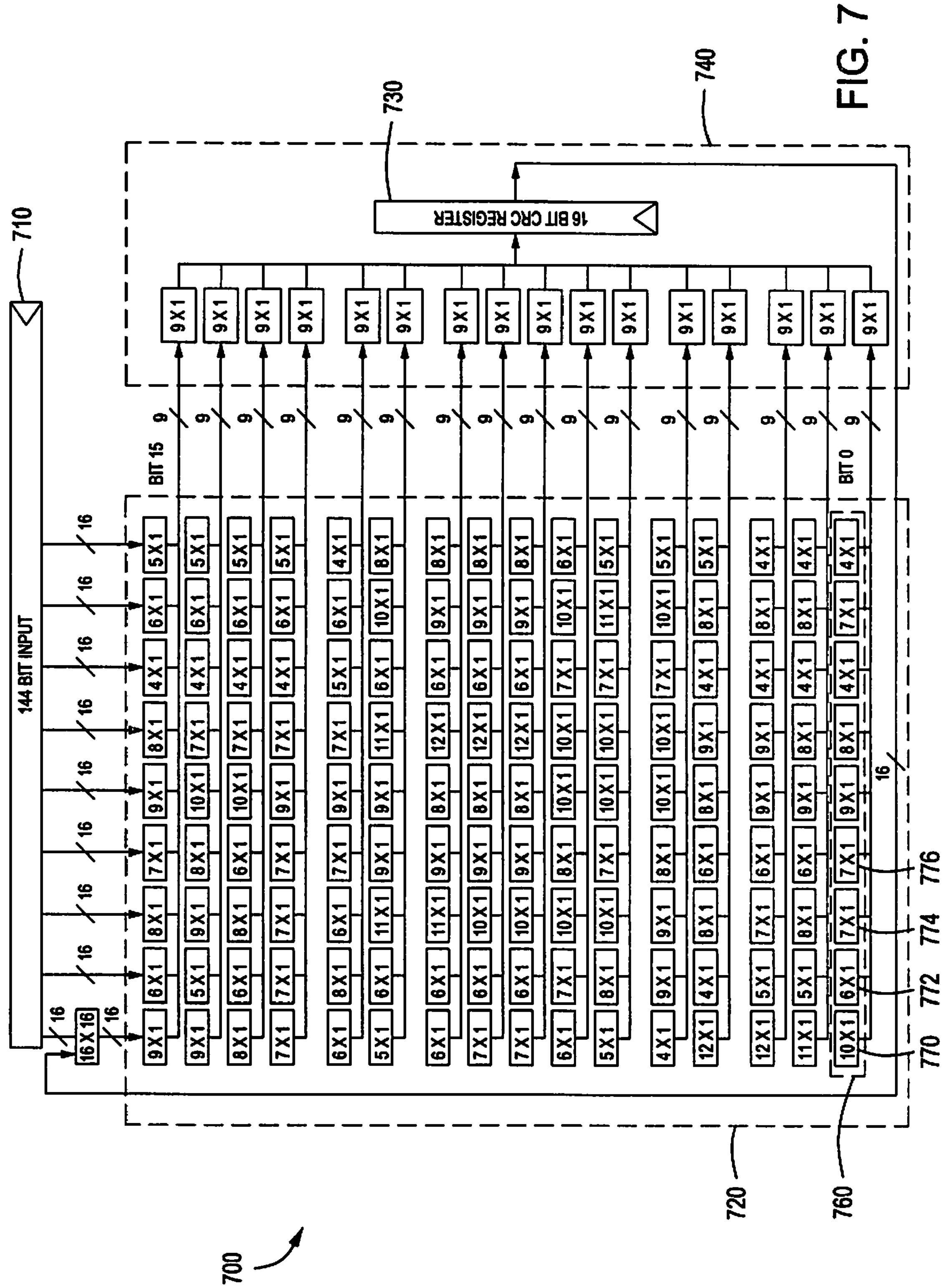
FIG. 7 illustrates actual XOR usage in a structured parallel cyclic-redundancy check generation in accordance with one embodiment of the present invention.

Since each bit of the input may not be used in the multi-cycle cyclic redundancy check, as described above, the number of XOR gates required may be reduced. Reducing the number of gates used may result in a reduction in cost and may reduce the amount of space that is required. FIG. 7 illustrates structured parallel cyclic-redundancy check generation 700 for a 144-bit input 710. The first stage 720 is constructed with only as many XOR gates as are required, while the second stage 740 is constructed from sixteen 9×1 XOR blocks.

Figure 5:
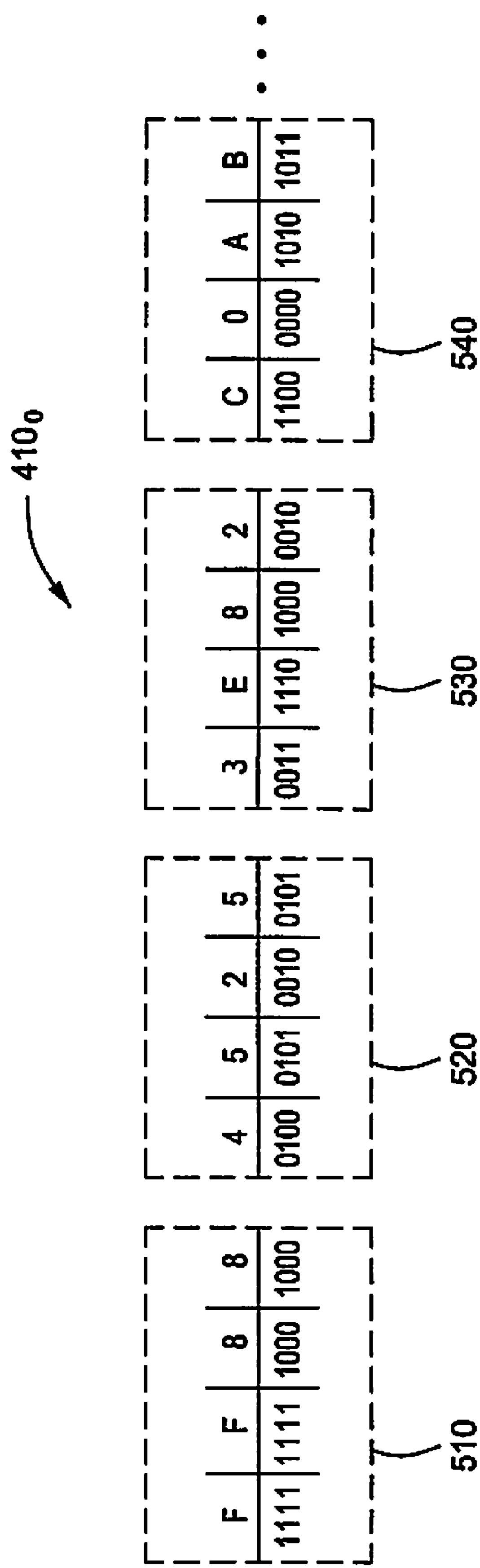
FIG. 5 illustrates a binary representation of four elements of the cyclic-redundancy check matrix in accordance with one embodiment of the present invention.

In FIG. 5 it was shown how the first four entries 510-540 of row Bit 0 $\mathbf{410}_0$ could be represented in binary form. Summing the number of '1s' present in block entry 510 reveals that only ten '1s' are present. From this it may be determined that only ten XOR gates are needed. Row Bit 0 760 of the first stage 720 of the structured cyclic-redundancy check 700 contains nine XOR blocks of varying size. The first block 770 is a 10×1 XOR block corresponding to the first element of row Bit 0 $\mathbf{410}_0$. The second block 772 corresponds to the second element 520 of row Bit 0 $\mathbf{410}_0$. In FIG. 5 it is shown that element two 520 is 4525 in hexadecimal and contains six '1s' when written in binary form. Consequently block 772 is a 6×1 XOR block. While the values of elements three 530 and four 540 are different, 0x3E82 and 0xC0AB respectively, they both contain seven '1s'. As a result blocks three 774 and four 776 of row Bit 0 $\mathbf{410}_0$ are 7×1 XOR blocks.

Once the first stage 720 has calculated the intermediate CRC it may be passed to the second stage 740. The resulting CRC value, determined by the second stage 740, may then be stored in the register 730. From the CRC register 730 the CRC value may be entered into a 16×16 XOR block 750 to be combined with new input data.

In general, it may be found that the first stage array of 16×1 blocks are actually of varying sizes depending on the polynomial selected for the CRC generation. It may be typical for up to twelve bits to be required in each XOR block. A 144 bit data stream may be divided into nine 16 bit subvectors as described above. Each subvector may be applied to one of the sixteen XOR reduction trees corresponding to each bit in the cyclic-redundancy check (CRC). Each of the nine XOR reduction trees may then further reduced to produce the resulting running CRC value. The first subvector may also contain feedback from the previous cycle's CRC value to be included in the calculation of a subsequent cycle. The full XOR tree may require 8-9 levels of XOR2 blocks to be calculated in one cycle.

In certain situations, it may be desirable to have all of the XOR block in the first stage be of the same size. By insuring that each of XOR blocks of the first stage are the same size, procurement costs may be reduced. Production efficiency may also be increased by standardizing the size of the blocks in the first stage. Because reducing the size of the XOR blocks in the first stage depends on the polynomial chosen for the cyclic-redundancy check (CRC), keeping all the blocks of the first stage 16×1 may add flexibility and allow a different polynomial to be used.

Figure 8:
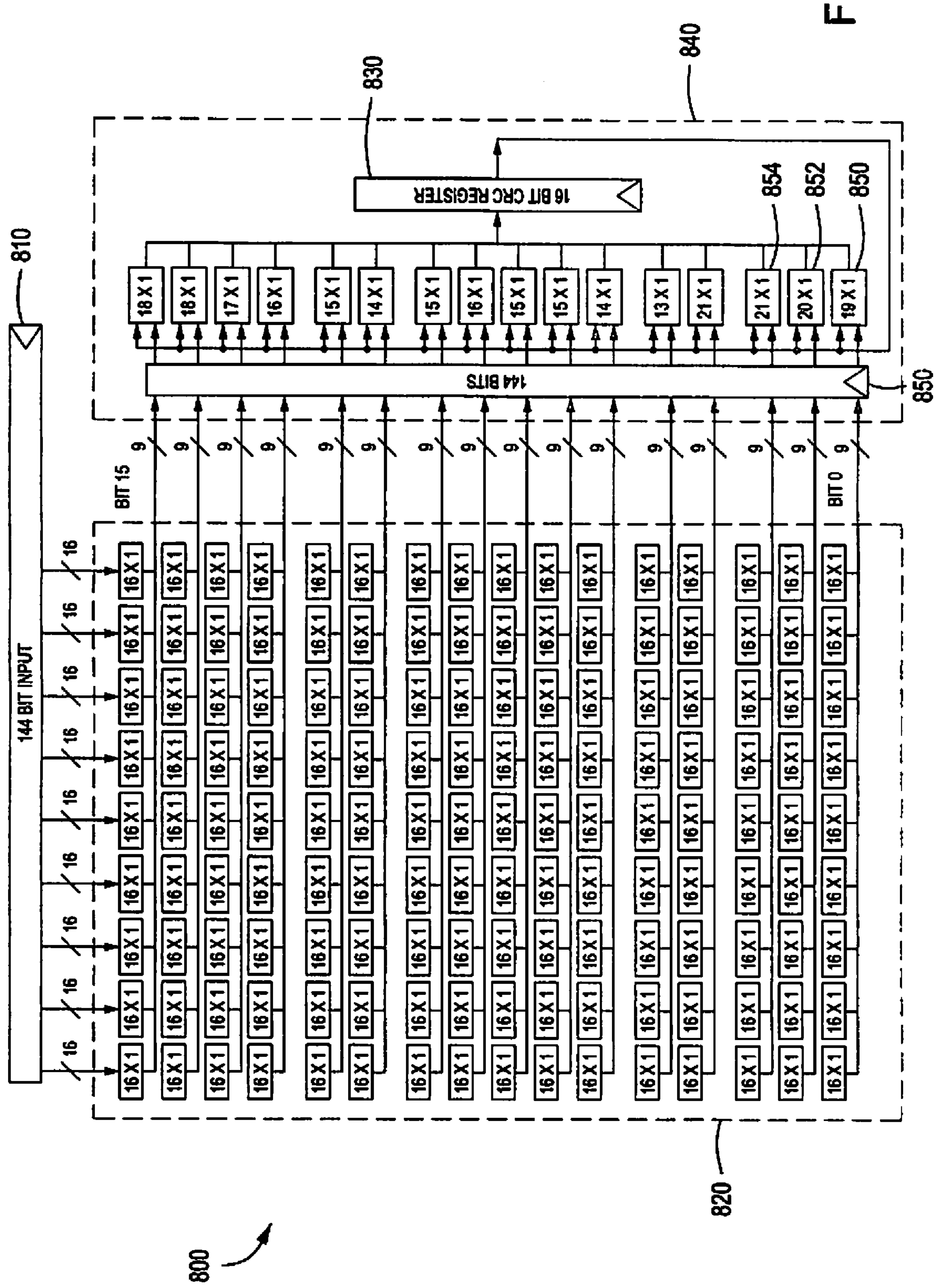
FIG. 8 illustrates pipelined structured parallel CRC generation in accordance with one embodiment of the present invention.

In some embodiments, it may be desirable for the size of the blocks of the first stage to be uniform and it may be desirable to have the CRC feedback occur at the second stage, rather than the first. FIG. 8 illustrates a pipelined structured parallel CRC generation 800 with feedback occurring at the second stage. Data may enter through a 144 bit input 810 and pass to a first stage 820. The first stage 820 may be constructed of sixteen rows and nine columns of 16×1 XOR gates. The calculated CRC from the register 830 is not incorporated into the first stage 820. Instead, the first stage 820 calculates a subvector and outputs 144 bits at 850.

In the second stage 840, the calculated CRC from the register 830 is incorporated. Because of the CRC feedback, the XOR blocks of the second stage may not be of uniform size. For example, since bit 0 of subvector 0 is included in the calculation of CRC bits 0:2, 5:7, and 11:15 in the single cycle CRC circuit, this bit is now used to extend the 9:1 XOR tree in the second stage by an additional bit to include the feedback. The same technique may be extended for the remaining fifteen bits of the CRC. This may result in second stage 840, where there are XOR blocks of varying size, including a 19×1 XOR block 850, a 20×1 XOR block 852 and a 21×1 XOR block 854.

In general, by breaking the XOR tree into the two pipelined stages 820 and 840 depicted in FIG. 8, the longest path length through the XOR tree may be 4 cycles in the first stage 820 and 5 cycles in the second stage 840. Since the feedback from the current CRC register may be required to calculate subsequent CRC values, it may be fed back into only the second stage of the pipeline by introducing its effects into only those XOR reduction trees where the bit would have an effect. This may widen and deepen the XOR path in the second stage 840, yet it may still result in an overall reduction in the maximum path length by nearly half.

CONCLUSION

While the foregoing is directed to embodiments of the present invention, other and further embodiments of the invention may be devised without departing from the basic scope thereof, and the scope thereof is determined by the claims that follow.

What is claimed is:

1. A method of calculating an error detection code in a pipelined circuit comprising:

generating an intermediate value by performing a first portion of an error detection code algorithm, based on a multi-bit data structure, in a first pipeline stage of the pipelined circuit in a first clock cycle;

generating a final value for the error detection code by performing a second portion of the error detection code algorithm, based on the intermediate value, in a second pipeline stage of the pipelined circuit in a second clock cycle; and feeding back a final value of an error detection code calculated by the second stage of the pipelined circuit into the first stage of the pipelined circuit for use in calculating a subsequent intermediate value.

2. The method of claim 1, wherein the error detection code comprises a Cyclic Redundancy Checksum (CRC).

3. The method of claim 1, wherein the second clock cycle immediately follows the first clock cycle.

4. The method of claim 1, wherein the error correction value comprises at least 16 bits.

5. The method of claim 1, wherein the multi-bit data structure comprises at least 128 bits.

6. A method of calculating an error detection code in a pipelined circuit, comprising:

generating an intermediate value by performing a first portion of an error detection code algorithm, based on a multi-bit data structure, in a first pipeline stage of the pipelined circuit in a first clock cycle;

generating a final value for the error detection code by performing a second portion of the error detection code algorithm, based on the intermediate value, in a second pipeline stage of the pipelined circuit in a second clock cycle; and feeding back a final value of an error detection code into the second stage of the pipelined circuit for use in calculating a subsequent final value of an error detection code.

7. A pipelined circuit for generating a checksum for a multi-bit data structure, comprising:

a first pipeline stage for generating an intermediate value by performing a first portion of an error detection code algorithm, based on the multi-bit data structure, in a first clock cycle;

at least a second pipeline stage for generating a final value of the checksum by performing a second portion of the error detection code algorithm, based at least on the intermediate value, in a second clock cycle;

a register for storing the checksum; and a feedback path for feeding back a previously calculated checksum value from the register into the first stage for use in calculating a subsequent intermediate value.

8. The pipelined circuit of claim 7, wherein the checksum comprises a Cyclic Redundancy Checksum (CRC).

9. The pipelined circuit of claim 7, wherein the first pipeline stage generates an intermediate value having an equal number of bits to the final value of the checksum.

10. A pipelined circuit for generating a checksum for a multi-bit data structure, comprising:

a first pipeline stage for generating an intermediate value by performing a first portion of an error detection code algorithm, based on the multi-bit data structure, in a first clock cycle;

at least a second pipeline stage for generating a final value of the checksum by performing a second portion of the error detection code algorithm, based at least on the intermediate value, in a second clock cycle; and a feedback path for feeding back a previously calculated checksum value from the register into the second stage for use in calculating a subsequent checksum.

11. An integrated circuit device, comprising:

a communications link to connect with external devices;

at least one processor core;

input/output (I/O) logic for transferring data in packets between the processor core and the communications link; and checksum logic configured to calculate checksums to be appended to data packets transmitted from the device via the communications link and to calculate checksums to validate data received via the communications link, the checksum logic including, a first pipeline stage for generating an intermediate value by performing a first portion of an error detection code algorithm, based on the multi-bit data structure, in a first clock cycle, at least a second pipeline stage for generating a final value of the checksum by performing a second portion of the error detection code algorithm, based at least on the intermediate value, in a second clock cycle, a register for storing the checksum, and a feedback path for feeding back a previously calculated checksum value from the register into the first stage for use in calculating a subsequent intermediate value.

* * * * *